United States Patent [19]
Johnson et al.

[11] Patent Number: 6,134,043
[45] Date of Patent: *Oct. 17, 2000

[54] COMPOSITE PHOTONIC CRYSTALS

[75] Inventors: Steven G. Johnson, St. Charles, Ill.; Shanhui Fan, Somerville, Mass.; Pierre R. Villeneuve, Boston, Mass.; Leslie Kolodziejski; John D. Joannopoulos, both of Belmont, Mass.

[73] Assignee: Massachusetts Institute of Technology, Cambridge, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 09/132,580

[22] Filed: Aug. 11, 1998

[51] Int. Cl.$^7$ ................................................ G02B 26/00
[52] U.S. Cl. ............................................................ 359/237
[58] Field of Search ............................................. 359/237

[56] References Cited

U.S. PATENT DOCUMENTS

| | | | |
|---|---|---|---|
| 3,095,549 | 6/1963 | Butler | 333/246 |
| 4,675,620 | 6/1987 | Fullerton | 333/1 |
| 4,961,619 | 10/1990 | Hernandez-Gil et al. | 385/132 |
| 5,157,756 | 10/1992 | Nishimoto | 385/129 |
| 5,187,461 | 2/1993 | Brommer et al. | 333/219.1 |
| 5,406,573 | 4/1995 | Ozbay et al. | 372/43 |
| 5,440,421 | 8/1995 | Fan et al. | 359/344 |
| 5,471,180 | 11/1995 | Brommer et al. | 333/202 |
| 5,526,449 | 6/1996 | Meade et al. | 385/14 |
| 5,600,483 | 2/1997 | Fan et al. | 359/344 |
| 5,677,924 | 10/1997 | Bestwick | 372/96 |
| 5,684,817 | 11/1997 | Houdre et al. | 372/45 |
| 5,688,318 | 11/1997 | Milstein et al. | |
| 5,748,057 | 5/1998 | De Los Santos | 333/134 |
| 5,751,466 | 5/1998 | Dowling et al. | 359/248 |
| 5,784,400 | 7/1998 | Joannopoulos et al. | 372/96 |

FOREIGN PATENT DOCUMENTS

| | | |
|---|---|---|
| 0473983 | 3/1992 | European Pat. Off. . |
| WO 97/04340 | 2/1997 | WIPO . |
| WO 98/25314 | 6/1998 | WIPO . |
| WO 98/44368 | 10/1998 | WIPO . |

OTHER PUBLICATIONS

Fan, S., Joannopoulos, J.D., Schubert, E. F., Villeneuve, P.R., "Light–Emitting Diodes: Research, Manufacturing, and Applications," *Photonic Crystal Light Emitting Diodes*, Feb. 1997, p. 67–73.

Foresi, J.S., P.R. Villeneuve, J. Ferrera, E.R. Thoen, G. Steinmeyer, S. Fan, J.D. Joannopoulos, L.C. Kimerling, Henry I. Smith, E.P. Ippen, "Photonic–bandgap microcavities in optical waveguides," *Nature*, vol. 390, Nov. 13, 1997, pp. 143–145.

(List continued on next page.)

*Primary Examiner*—Georgia Epps
*Assistant Examiner*—D. Spector
*Attorney, Agent, or Firm*—Samuels, Gauthier & Stevens, LLP

[57] ABSTRACT

A composite photonic crystal structure comprising a guide crystal configured in a lane having a dielectric periodicity in at least a first direction in the plane; and barrier crystals configured above and below the guide crystal to confine light within the guide crystal, the barrier crystals having a dielectric periodicity in at least a second direction not in the plane. In another embodiment, there is provided a composite photonic crystal structure comprising a guide crystal configured in a plane having a dielectric periodicity in at least one dimension; and a barrier crystal configured adjacent the guide crystal to confine light within the guide crystal, the barrier crystal having a dielectric periodicity in at least two dimensions.

32 Claims, 13 Drawing Sheets

OTHER PUBLICATIONS

Hirayama, Hideki, Tetsuko Hamano, Yoshinobu Aoyagi, "Novel surface emitting laser diode using photonic band–gap crystal cavity," *Appl. Phys. Lett.*, vol. 69, No. 6, Aug. 5, 1996, pp. 791–793.

Meade, Robert D., A. Devenyi, J.D. Joannopoulos, O.L. Alerhand, D.A. Smith, K. Kash, "Novel applications of photonic band gap materials: Low–loss bends and high Q cavities," *J. Appl. Phys.*, vol. 75, No. 9, May 1, 1994, pp. 4753–4755.

*Patent Abstracts of Japan,* Application No. 05037692, Filed Feb. 26, 1993, Sugimoto Mitsunori, "Surface–Emission Laser and Manufacture Thereof."

*Patent Abstracts of Japan,* Application No. 09108271, Filed Apr. 10, 1997, Sakata Hajime, "Vertical Resonator Laser Having Photonic Band Structure."

Wendt, J.R., G.A. Vawter, P.L. Gourley, T.M. Brennan, B.E. Hamons, "Nanofabrication of photonic lattice structures in GaAs/AlGaAs," *Journal of Vacuum Science & Technology B,* vol. 11, No. 6, Nov./Dec. 1993, pp. 2637–2640.

COMPOSITE PHOTONIC CRYSTALS

SPONSORSHIP INFORMATION

This invention was made with government support under Grant No. 9400334-DMR awarded by National Science Foundation. The government has certain rights in the invention.

BACKGROUND OF THE INVENTION

The invention relates to photonic crystals, and in particular to composite photonic crystals comprising one- and two-dimensionally periodic photonic crystals.

The development of photonic crystals, structures with band gaps that prevent the propagation of light in a certain frequency range, has led to proposals of many novel devices for important applications in lasers, opto-electronics, and communications. Among these devices are high-Q optical filters, waveguides permitting tight bends with low losses, channel-drop filters, efficient LEDs, and enhanced lasing cavities. All of these devices, however, require the fabrication of photonic crystals allowing confinement of light in three dimensions. Moreover, the length scale of the features in a structure must be on the order of microns in order to control light of wavelengths typical in opto-electronics and other applications.

It is therefore desirable to obtain quasi-3D photonic crystals that approximate the most desirable properties of true three-dimensionally periodic crystals, but are potentially much easier to fabricate since they are composed of lower-dimensionally periodic components. The most straightforward way of achieving a photonic crystal in three dimensions is to utilize a structure with a true three-dimensional band gap. Here, light whose frequency is in the band gap cannot propagate in any direction through the crystal. Such a structure has been described in U.S. Pat. Nos. 5,440,421 and 5,600,483, of common assignee, and much effort has been expended in attempting to construct it. Fabrication of this and other true 3D structures has proved difficult, however, due to the complicated three-dimensional connectivity of these crystals and their extreme sensitivity to inter-layer alignment.

An alternative approach that has been successfully applied is to take a one- or two-dimensionally periodic photonic crystal and to truncate it in the second and/or third dimensions using index confinement, classically known as total internal reflection (TIR), and described in U.S. Pat. No. 5,526,449. The foregoing patent refers to structures with one- or two-dimensional periodicities and band gaps as 1D or 2D photonic crystals, respectively, although they may exist in three dimensions. TIR allows light to be guided within a high index (high dielectric constant, $\in$) material surrounded by a low index material. When this effect is combined with a photonic crystal, the resulting hybrid can approximately localize light in a point-like region, a resonant cavity, where the structure has been altered. This alteration, and the resulting resonant cavity, is referred to as a point defect.

Light can even be perfectly guided along a waveguide or line defect, a one-dimensionally periodic line-like region of defects in the periodic structure. A one-dimensionally periodic TIR-based photonic crystal has, in fact, been fabricated successfully as reported by Foresi et al., "Measurement of Photonic Band Gap Waveguide Microcavities," Nature 390, p. 143–145 (1997). Since it does not have a true three-dimensional band-gap, however, light cannot be perfectly confined. Instead, it leaks out slowly. The lifetime according to which localized light leaks out is described by the quality factor, or Q, of the defect. For most applications (including all of those mentioned above), it is critical that the Q of a point defect be as large as possible. Although TIR designs provide adequate values of Q, one would like to do better.

SUMMARY OF THE INVENTION

The invention provides a design of a quasi three-dimensionally periodic photonic crystal. Such a structure is a composite of one- and two-dimensionally periodic photonic crystals, consisting of a photonic crystal guide region surrounded by photonic crystal barrier regions. This design allows confinement of light to a resonant cavity using a point defect, as well as enabling the formation of waveguides using line defects. Quasi-3d crystals have the advantage of being considerably more amenable to fabrication than structures with true three-dimensional periodicity.

According to the present invention, there is provided a composite photonic crystal structure comprising a guide crystal configured in a plane having a dielectric periodicity in at least a first direction in the plane; and barrier crystals configured above and below the guide crystal to confine light within the guide crystal, the barrier crystals having a dielectric periodicity in at least a second direction not in the plane.

In another embodiment, there is provided a composite photonic crystal structure comprising a guide crystal configured in a plane having a dielectric periodicity in at least one dimension; and a barrier crystal configured adjacent the guide crystal to confine light within the guide crystal, the barrier crystal having a dielectric periodicity in at least two dimensions.

These and other objects, features and advantages of the present invention will become apparent in light of the following detailed description of preferred embodiments thereof, as illustrated in the accompanying drawings.

BRIEF DESCRIPTION OF THE DRAWINGS

FIGS. 6A and 6B are plots of projected band structures for square lattice of truncated rods in air for heights of 0.6a and 1.6a, relative to the horizontal lattice constant a;

FIG. 7 is a graph of an abstract band structure for a defect state in the guide crystal, indicating the states in the light cone that it can couple to;

DETAILED DESCRIPTION OF THE INVENTION

Figure 1:
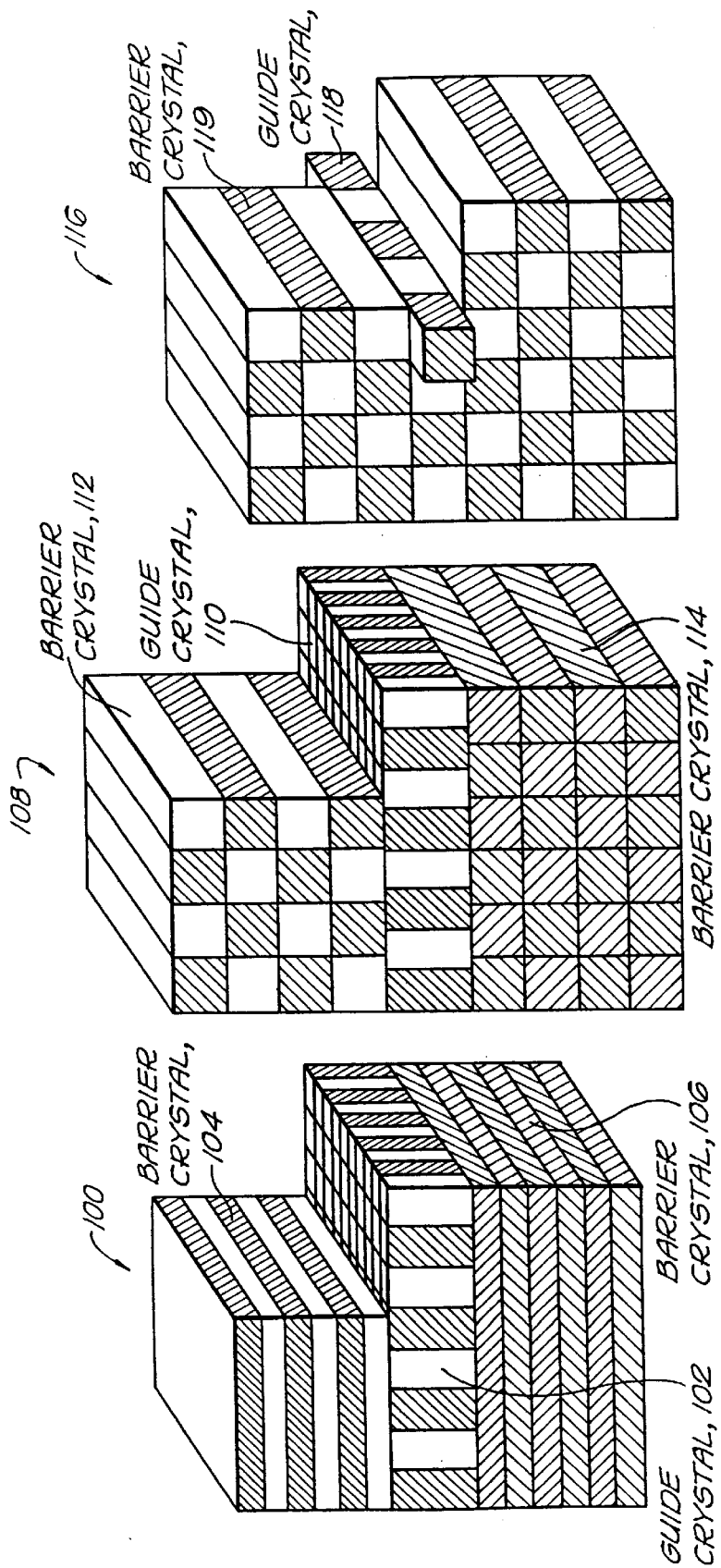
FIGS. 1A–1C are block diagrams of composite photonic crystals in accordance with the invention.

The invention involves a new class of dielectric structure, composite or quasi-3D photonic crystals, that improve the attainable quality factors while retaining the relative ease of fabrication and analysis of TIR designs. FIGS. 1A–1C are block diagrams of composite photonic crystals in accordance with the invention, with portions of the crystals cutaway to illustrate the interior structure. Composite or quasi-3D structures are one- or two-dimensionally periodic photonic crystals (i.e., structures with band gaps in one or two dimensions) that are bounded in the remaining dimensions by other one- or two-dimensionally periodic crystals. Quasi-3d crystals can, in addition, make use of total internal reflection to further enhance confinement.

A quasi-3D photonic crystal consists of two components, a guide crystal and a barrier crystal (or crystals). The guide crystal is a slab or rod consisting of a two- or one-dimensionally periodic photonic crystal, respectively, and is the layer of material in which light is to be guided or trapped, or in which resonances are to be formed. A barrier crystal is a one- or two-dimensionally periodic photonic crystal that helps to confine light within the guide crystal-ideally, it reflects any light trying to escape from the guide crystal. There can be more than one kind and dimensionality of barrier crystal surrounding the guide crystal. A barrier crystal can also have a lower average dielectric constant than the guide crystal, in which case confinement of light is further enhanced by total internal reflection.

FIG. 1A is a block diagram of a composite photonic crystal 100 which includes a two-dimensionally periodic guide crystal 102 bounded by a one-dimensionally periodic barrier crystals 104,106. FIG. 1B is a block diagram of a composite photonic crystal 108 which includes a two-dimensionally periodic guide crystal 110 bounded by two-dimensionally periodic barrier crystals 112,114. FIG. 1C is a block diagram of a composite photonic crystal 116 which includes a one-dimensionally periodic guide crystal 118 bounded by a two-dimensionally periodic barrier crystal 119.

Figure 2:
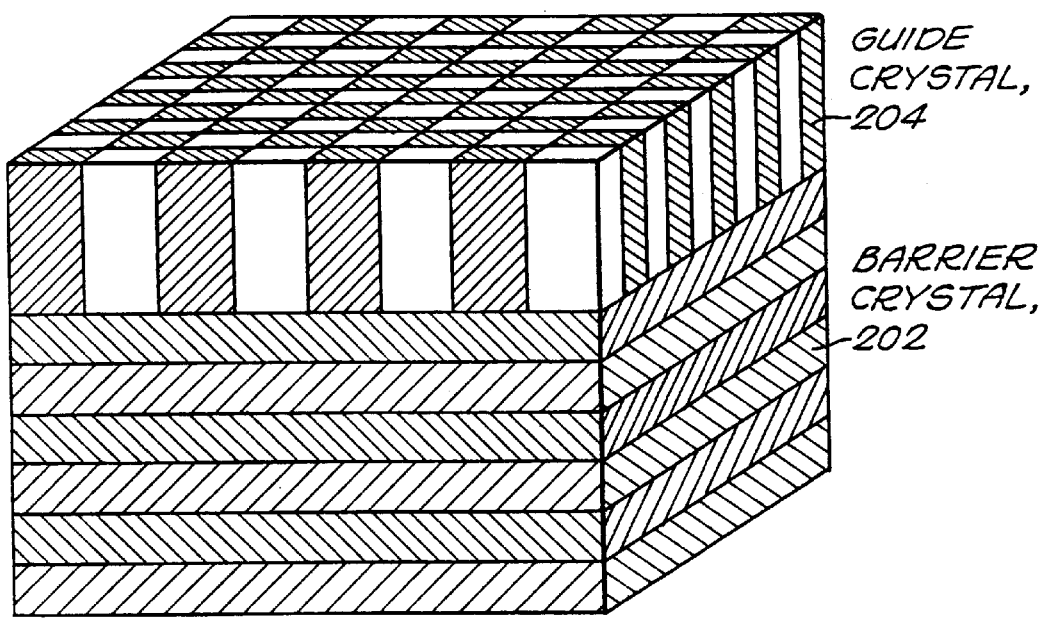
FIG. 2 is block diagram of a hybrid quasi-3D/TIR photonic crystal structure.

FIG. 2 illustrates a block diagram another embodiment of the invention, in which a barrier crystal 202 is used to confine light in some directions of a guide crystal 204, and TIR to confine it in others, producing a hybrid structure 200. Essentially, it is desirable to match the gap frequencies of the various photonic crystals making up the quasi-3D structure. Each gap prevents the propagation of light in a particular direction, and when combined they can form a quasi-gap that imperfectly confines light in all directions. Thus, approximate confinement of light modes in a point defect may be obtained. Additionally, it is possible to achieve perfect confinement of light in a one-dimensionally periodic line defect.

Since the guide and barrier crystals consist of only one- or two-dimensionally periodic dielectric variations, they are relatively simple to manufacture compared to true three-dimensionally periodic structures. Furthermore, no special alignment is required between the different crystals, reinforcing the ease of fabrication of such devices.

Ideally it is useful to think of the light in a 2D guide crystal as if it were propagating in the true two-dimensional system, which is easily studied and understood, and for which extensive theoretical results exist. Although the two-dimensional picture fails when it comes to quantitative results, its qualitative predictions still have strong analogues in the quasi-3D system. The two-dimensional model thus provides a simple guide to our intuition in understanding and designing quasi-3d systems.

The design of an actual quasi-3D composite photonic crystal structure that is shown to confine light with a high Q factor will now be described. The bulk of the design is done by analyzing each component of the structure independently, which allows for rough tuning of their characteristics using simple systems. Next, they are combined and the resulting structure is shown to have the desired properties. Finally, a large number of parameters result which may be tuned to further enhance the system. Most of the theoretical analysis of the crystal is done in terms of the light modes that can exist within the structure with a fixed oscillation frequency (as either standing or propagating waves), referred to as the modes or states of the crystal.

Figure 3:
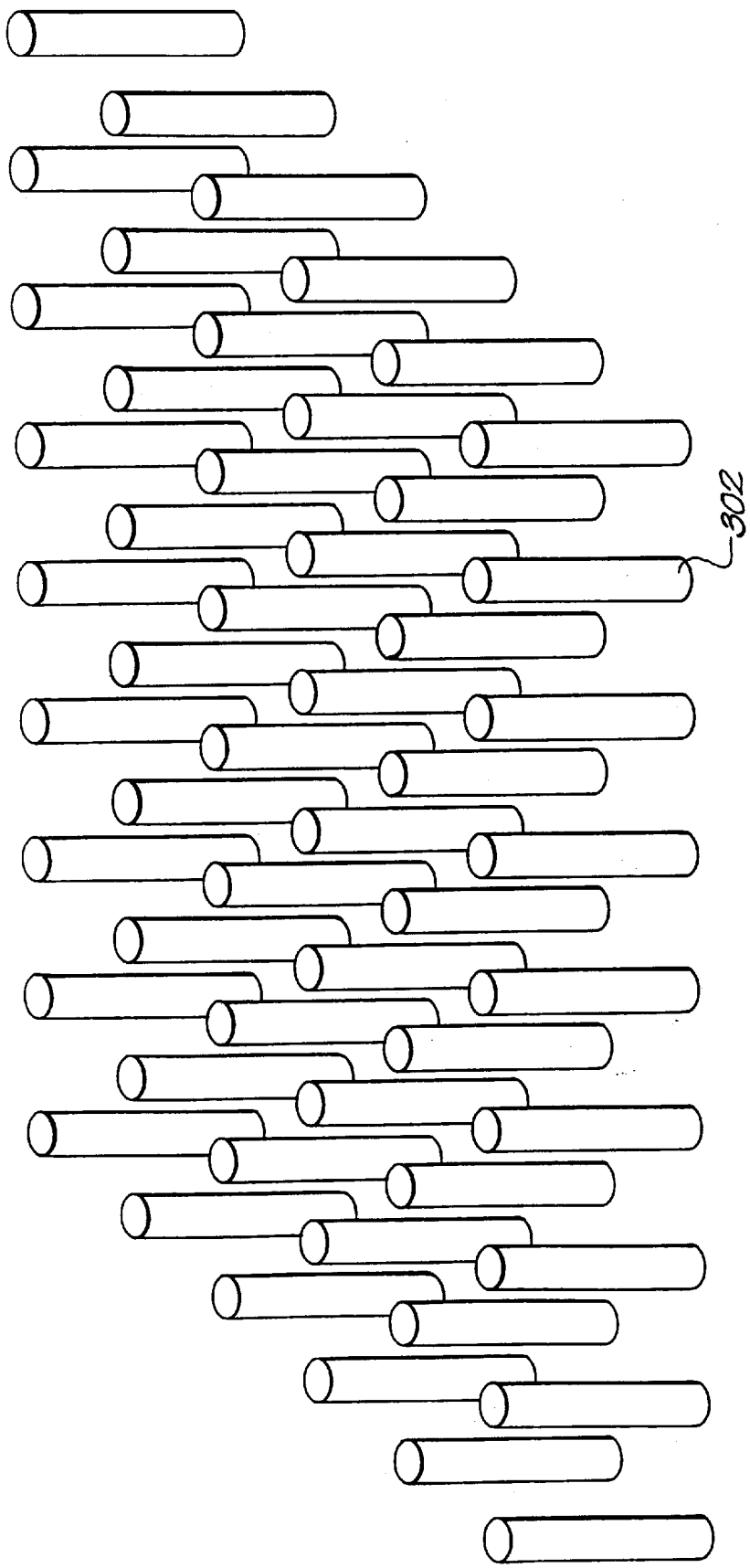
FIG. 3 is a block diagram of a guide crystal of the invention including an (infinite) two-dimensional slab consisting of a square lattice of dielectric rods in air.
Figure 4:
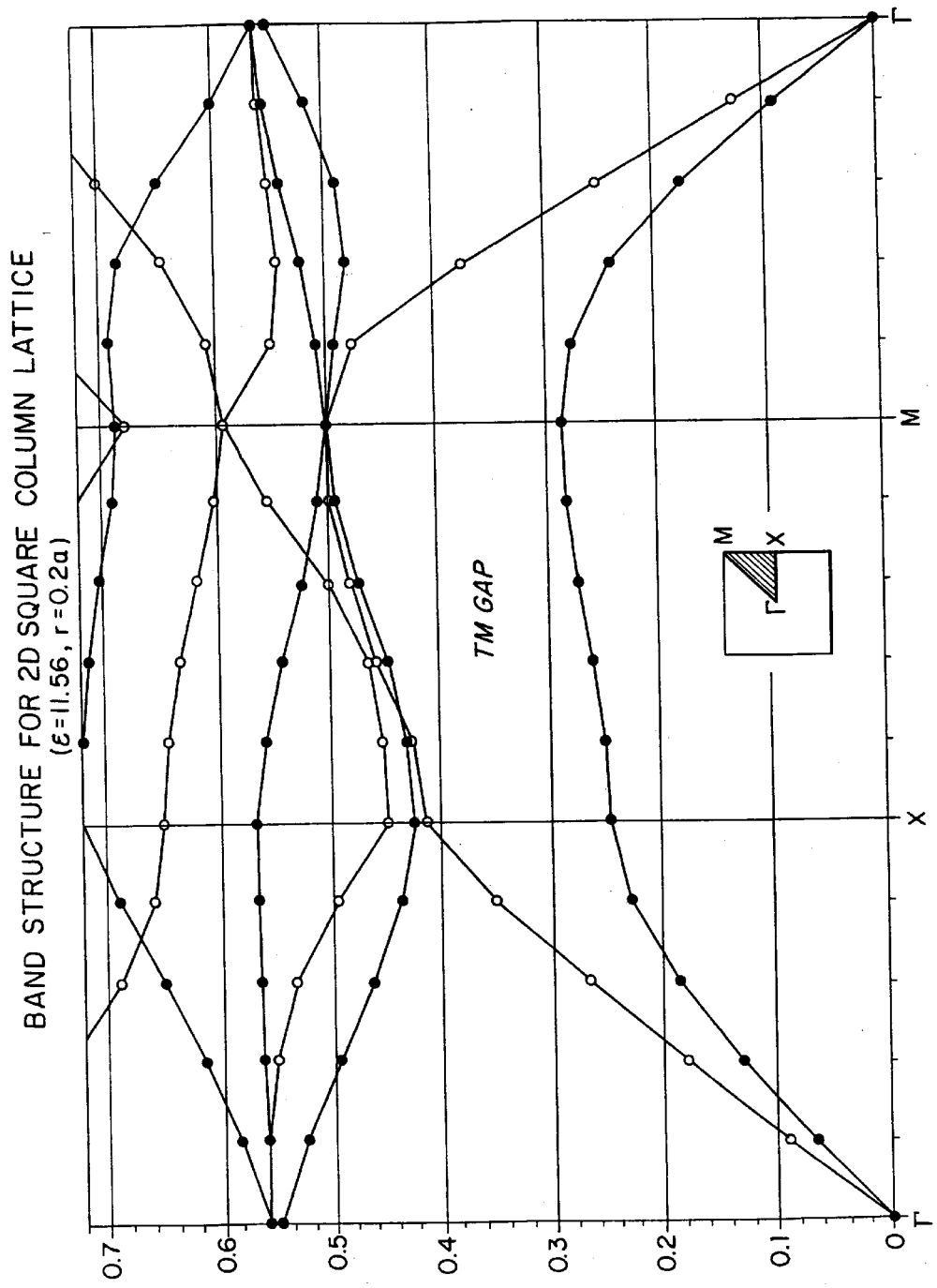
FIG. 4 is a plot of the band structure for the 2D square lattice of rods of FIG. 3.

For the guide crystal of the invention, an (infinite) two-dimensionally periodic slab 300 consisting of a square lattice of dielectric rods 302 in air is chosen, as shown in FIG. 3. The cross section of the rods is unimportant; in actual experimental computations, square rods were used. In this example, it will be assumed that the rods are made out of silicon, with a dielectric constant of 11.56 in the frequency range of interest. The corresponding two-dimensional system has a photonic band gap for the TM (transverse magnetic) polarization of light, in which the electric field is parallel to the rods. FIG. 4 is a plot of the 2D band structure of FIG. 3. The other polarization, TE (transverse electric), in which the magnetic field is parallel to the rods, propagates freely at all frequencies.

When the rods are truncated into a slab, light can no longer be divided into pure TE and TM modes. However, there is still a mirror symmetry plane (bisecting the rods) that will serve to segregate the modes according to whether they are even or odd under reflection through this plane. The odd modes are analogous to the TM modes in the 2D system and have a corresponding quasi-gap. It will be appreciated by those skilled in the art any other 2D photonic crystal, or even a 1D waveguide, could have been chosen as a guide crystal as long as it had some sort of band gap.

The barrier crystals will consist of two Bragg mirrors, above and below the rods. Bragg mirrors are one-dimensionally periodic photonic crystals consisting of alternating slabs of two (or more) dielectric materials, and have a band gap that restricts propagation of light perpendicular to the planes. Again, any one-dimensionally periodic photonic crystal, or even a two-dimensional photonic crystal, could have been chosen so long as it prevents propagation of light in some direction away from the guide crystal. The band structure for the barrier crystals by themselves (assuming that they are infinite in extent) forms an envelope that will constrain the modes in the guide crystal.

Figure 5:
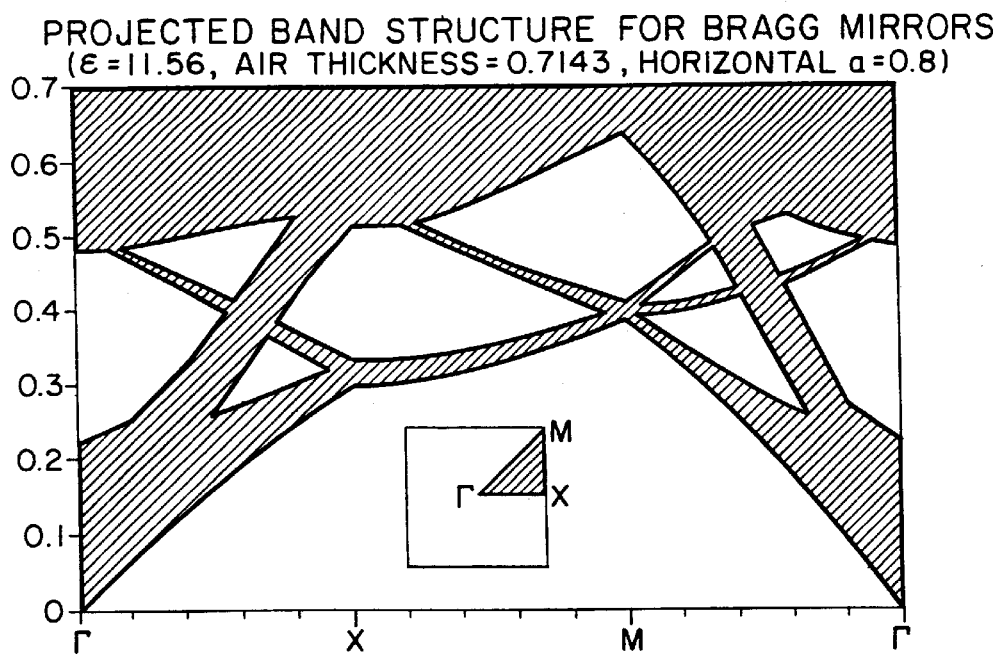
FIG. 5 is a plot of a band structure for a possible Bragg mirror, folded according to the periodicity of the guide crystal and projected onto the guide's 2D Brillouin zone.

FIG. 5 is a plot of a band structure for a possible Bragg mirror, folded according to the periodicity of the guide crystal and projected onto the guide's 2D Brillouin zone. That is, the frequency of a mode is plotted according to the component of its wavevector, k, which is in the plane of the mirrors. The projected k ranges between points (G, X, M) on the perimeter of the irreducible Brillouin zone, as shown in the figure. The shaded regions indicate possible light modes in the Bragg crystal. These modes are not confined in any way, and so coupling with the shaded regions must be prevented in order to create guided modes. Thus, it is desirable to work in the unshaded regions in the envelope of Bragg states; these regions will be referred to hereinafter as "bubbles". If states can be created inside these bubbles, they will be guided (they won't be able to couple with any states in the barrier crystals). Then, from these guided states modes will be created that are localized (albeit imperfectly) in both the guide and the barrier crystal-point defects.

Clearly, there are many possible choices of bubbles to work in-potentially, any of the bubbles can be used, depending upon the requirements of the system. In this example, attention will be focused on the bottom-most bubble, which corresponds to index confinement. In order to work in this bubble, the average dielectric constant in the barrier crystals must be made lower than that in the guide crystal. To do this, it will be assumed that the Bragg mirrors are made out of layers of silicon dioxide (with a dielectric constant of 2.1) and some other material with an $\in$ of 1.0. If the Bragg gap is maximized, this leads to an average dielectric constant of 1.4488 in the barrier crystals, versus an $\in$ of 2.33 in the guide crystal. Although the bottom bubble is purely an index confinement effect, there are also two bubbles on the sides, due to the band gap in the Bragg crystal, which will be taken advantage of. However, the discussion of these bubbles will be postponed until the guide crystal has been analyzed.

Figure 6A:
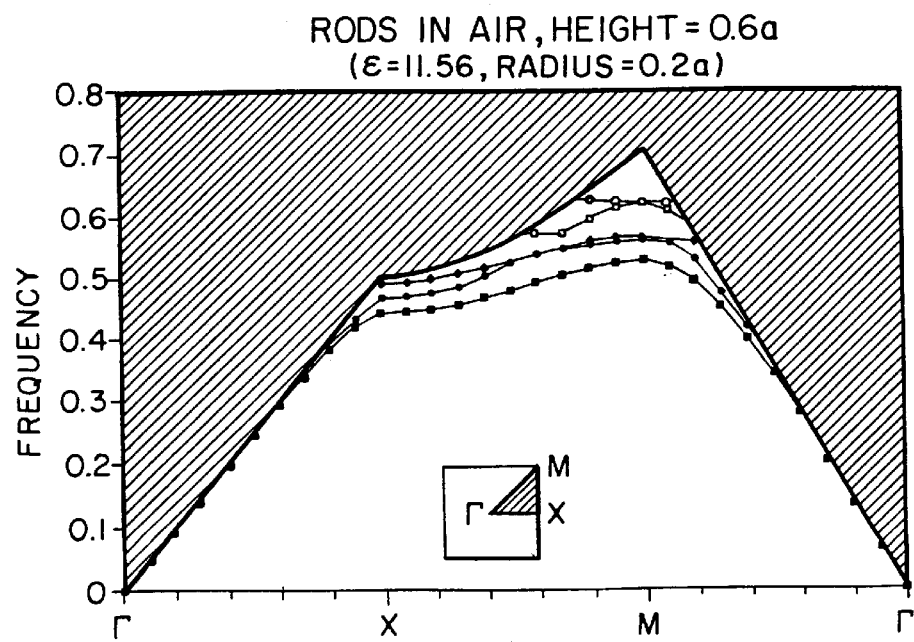
Figure 6B:
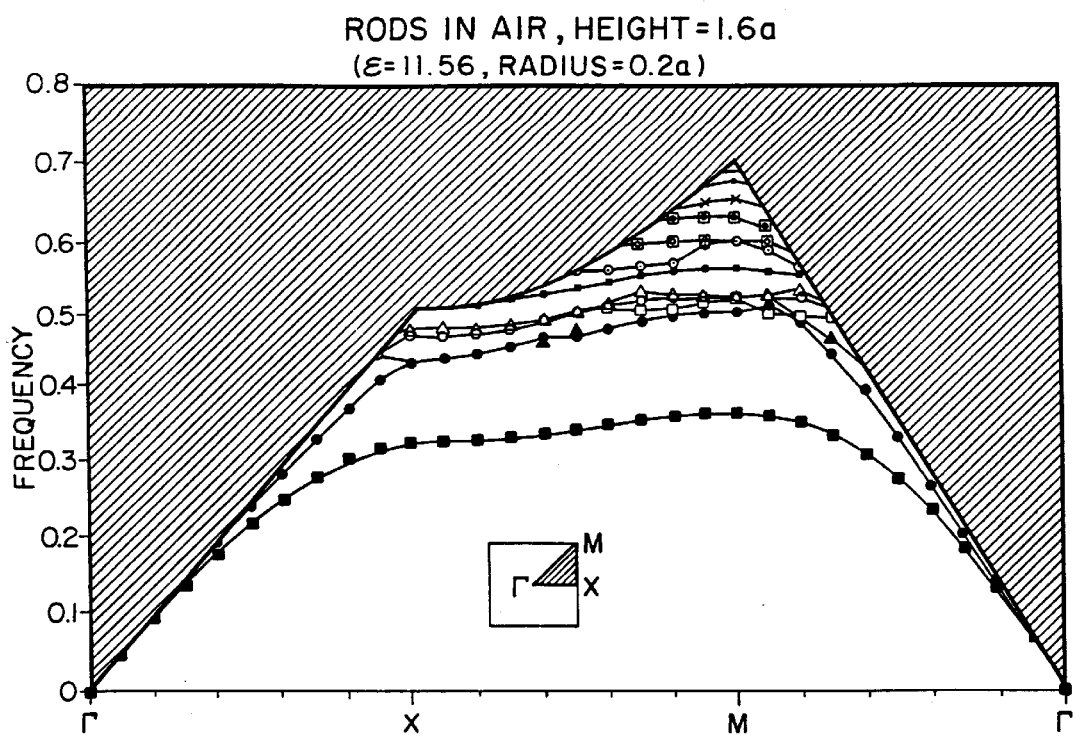

The guide crystal is based upon the 2D lattice of rods whose band structure is given in FIG. 4. When we the rods are truncated (in air, with no barrier crystals yet), this 2D band structure is essentially sandwiched into the light cone, consisting of modes that can propagate in the empty air. FIGS. 6A and 6B are plots of projected band structures for square lattice of truncated rods in air for heights of 0.6a and 1.6a, relative to the horizontal lattice constant a. The shaded region is the light cone. The bands under the light cone are guided modes, and are trapped in the plane of the rods because they cannot couple with modes propagating through the air. The TE and TM polarizations in 2D now become odd and even guided modes (with respect to the plane of symmetry). Just as there was a gap for TM modes in 2D, there is a gap for odd guided modes in this structure. By adjusting the rod height to between one and two times the horizontal lattice constant, it is possible to make this gap quite large. Similar results would be obtained for other possible guide crystals, but the dimensions would differ.

Figure 7:
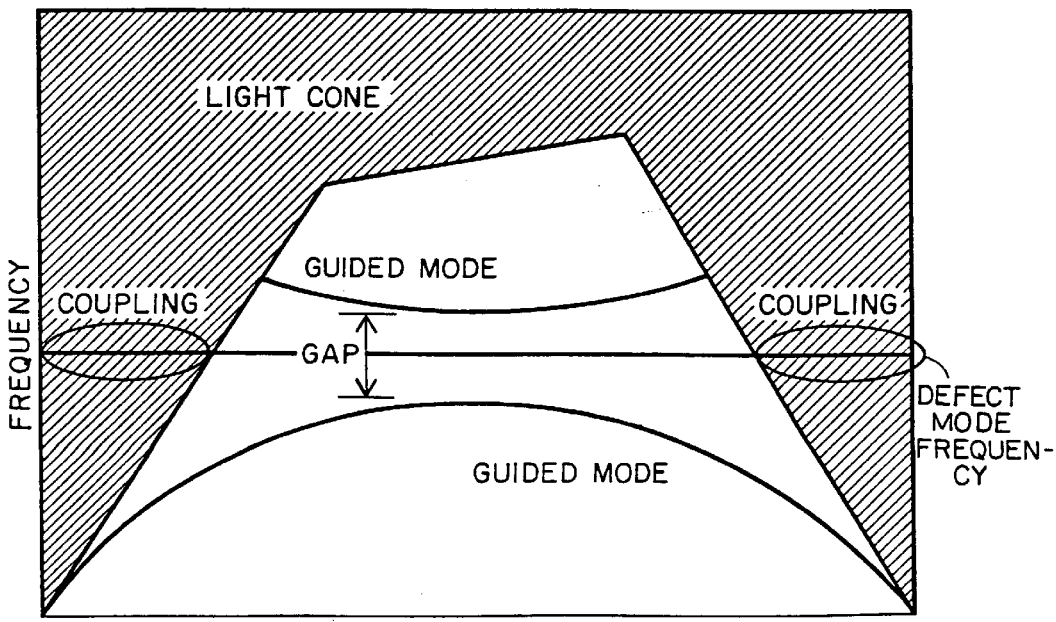

It is important to note that the "gap" in this system is only for the guided modes, and there are extended (light cone) modes with frequencies in the gap. Because of this, if a localized defect state is created in the gap, it will couple to modes in the light cone and slowly leak away into the air. FIG. 7 is a graph of an abstract band structure for a defect state in the guide crystal, indicating the states in the light cone that it can couple to, causing it to "leak out". It is impossible to completely eliminate this leakage without resorting to a true 3D photonic crystal. The goal is rather to minimize the coupling to these extended states and thus minimize the rate of leakage. In fact, because a defect state (formed by slightly altering the guide crystal in one location) can be made mostly out of guided modes, its coupling to extended states is already relatively weak. This is the principle of index-confinement structures, which allows them to confine light without having any additional photonic crystals.

The system can be improved, however, by using barrier crystals on either side of the guide crystal, rather than air. Essentially, "bubbles" can be positioned in the light cone right where a defect state would otherwise couple with the extended states. This reduces the number of states that a defect can couple to, thereby reducing the leakage and increasing the quality factor, Q. To do this, the frequencies of the bubbles (band gaps in the barrier crystals) need to be matched with the band gap in the guided modes of the guide crystal. The locations and sizes of the bubbles can be easily tuned by adjusting the dielectric constants, relative lattice constants, and other parameters of the crystals. In the case of the Bragg mirrors, the side bubbles will be moved down by adjusting the lattice constant of the Bragg mirrors relative to that of the guide crystal. When this is done, the resulting band structure is shown in FIG. 8, corresponding to the dielectric structure in shown in FIG. 9.

Figure 8:
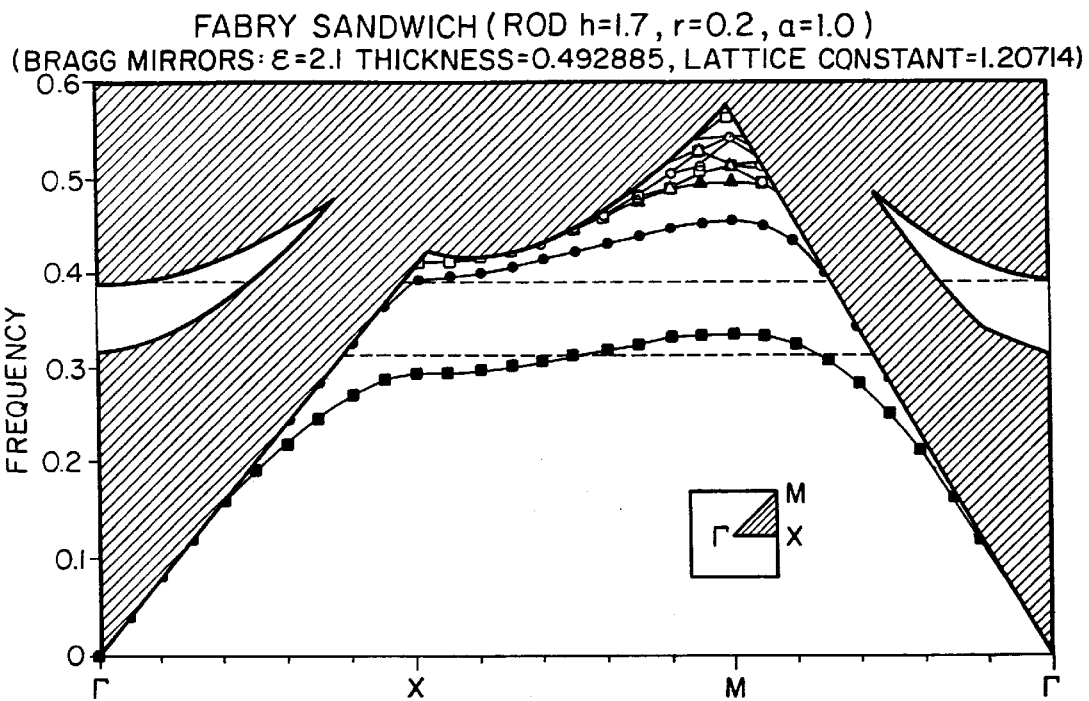
FIG. 8 is a plot of the band structure of a square lattice of rods sandwiched between two Bragg mirrors, effectively a composite quasi-3D photonic crystal.

FIG. 8 is a plot of the band structure of a square lattice of rods sandwiched between two Bragg mirrors, effectively a composite quasi-3D photonic crystal. The shaded regions denote the envelope of extended states in the Bragg mirrors. Also shown are the bands corresponding to modes localized in the guide crystal. The gap in the guided modes is aligned with the side bubbles caused by the band gap in the Bragg mirrors. This allows for the creation of high Q defect modes in the guide crystal.

Figure 9:
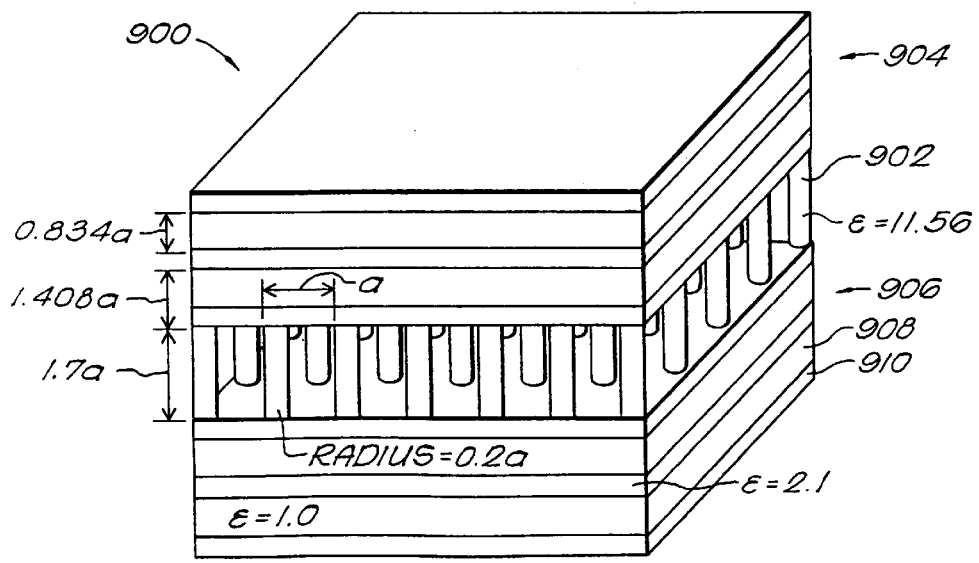
FIG. 9 is a block diagram of a composite photonic crystal 900 in accordance with the invention.

FIG. 9 is a block diagram of a composite photonic crystal 900 in accordance with the invention. The photonic crystal 900 includes a square lattice of rods 902 with a lattice constant a. The rods have a radius of 0.2a, a dielectric constant of $\in$=11.56, and a height of 1.7a. The rods are sandwiched between a pair of Bragg mirrors 904,906. Each of the Bragg mirrors includes alternating first 908 and second 910 layers. The first layers have a width of 0.834a and a dielectric constant $\in$=1.0. The second layers have a width of 0.574a and a dielectric constant $\in$=2.1.

Figure 10A:
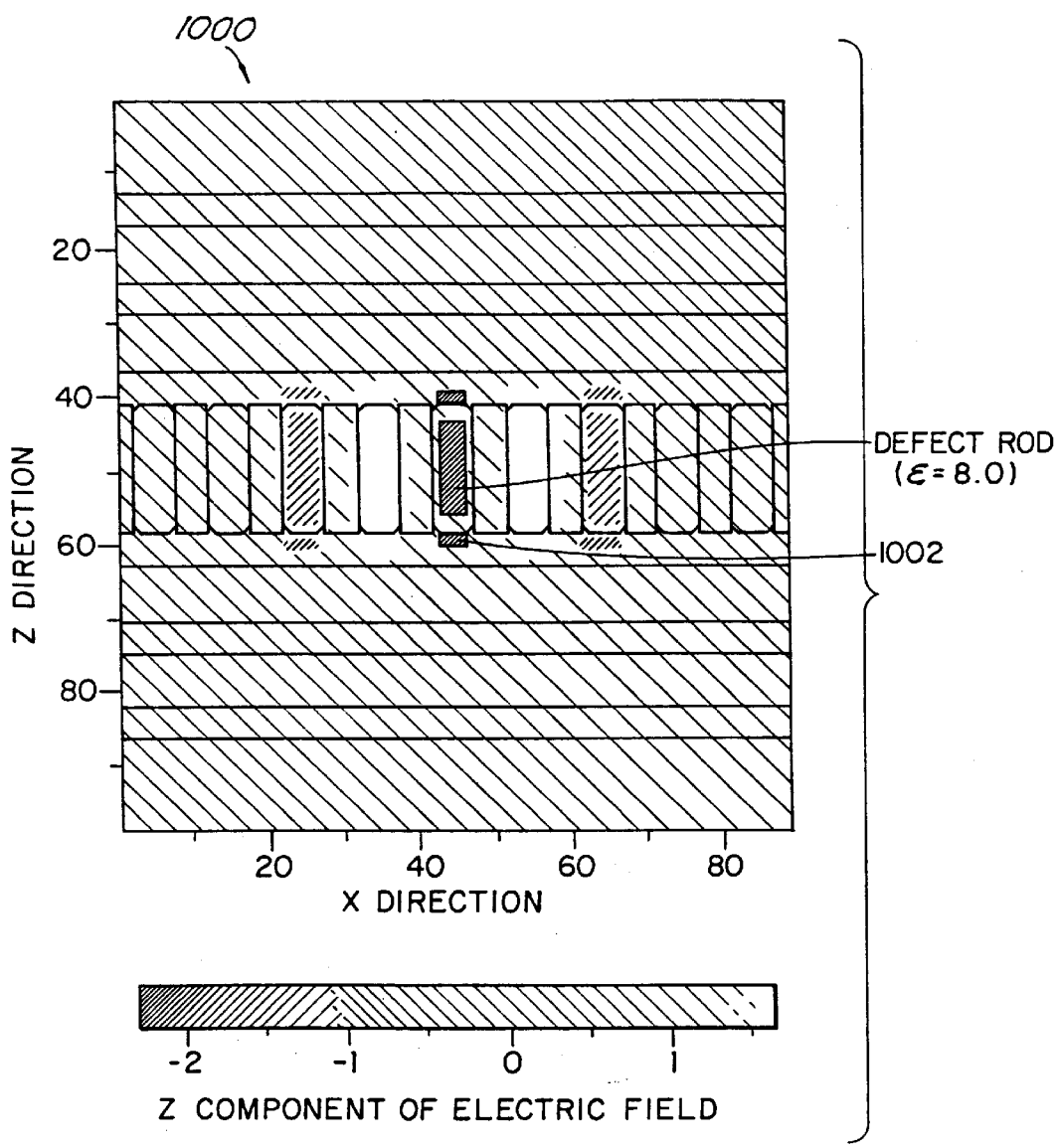
FIGS. 10A and 10B are cross sections of a point defect state in a quasi-3D photonic crystal including a defect rod in accordance with the invention with the component of the electric field parallel to the rods.
Figure 10B:
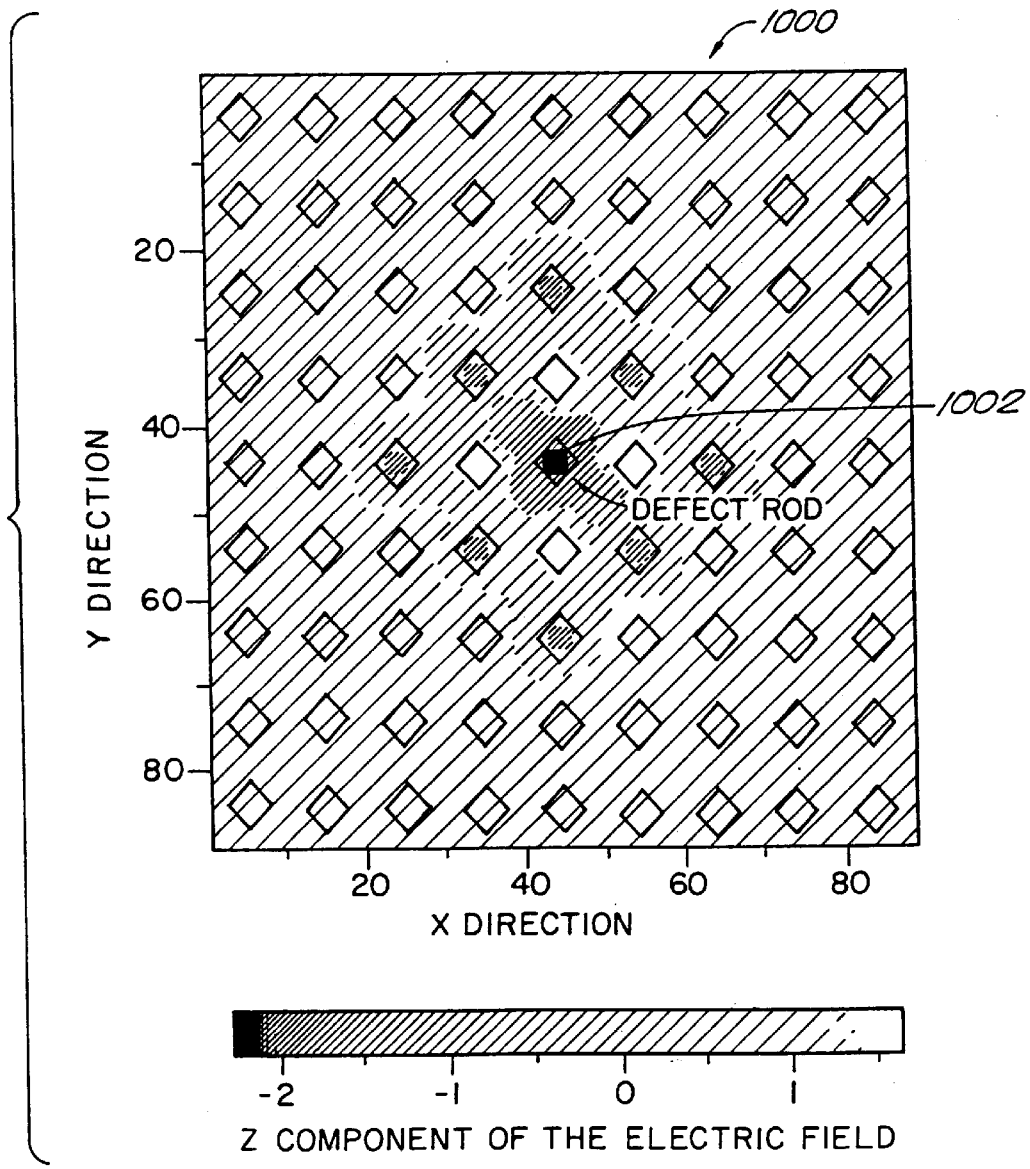
Figure 11:
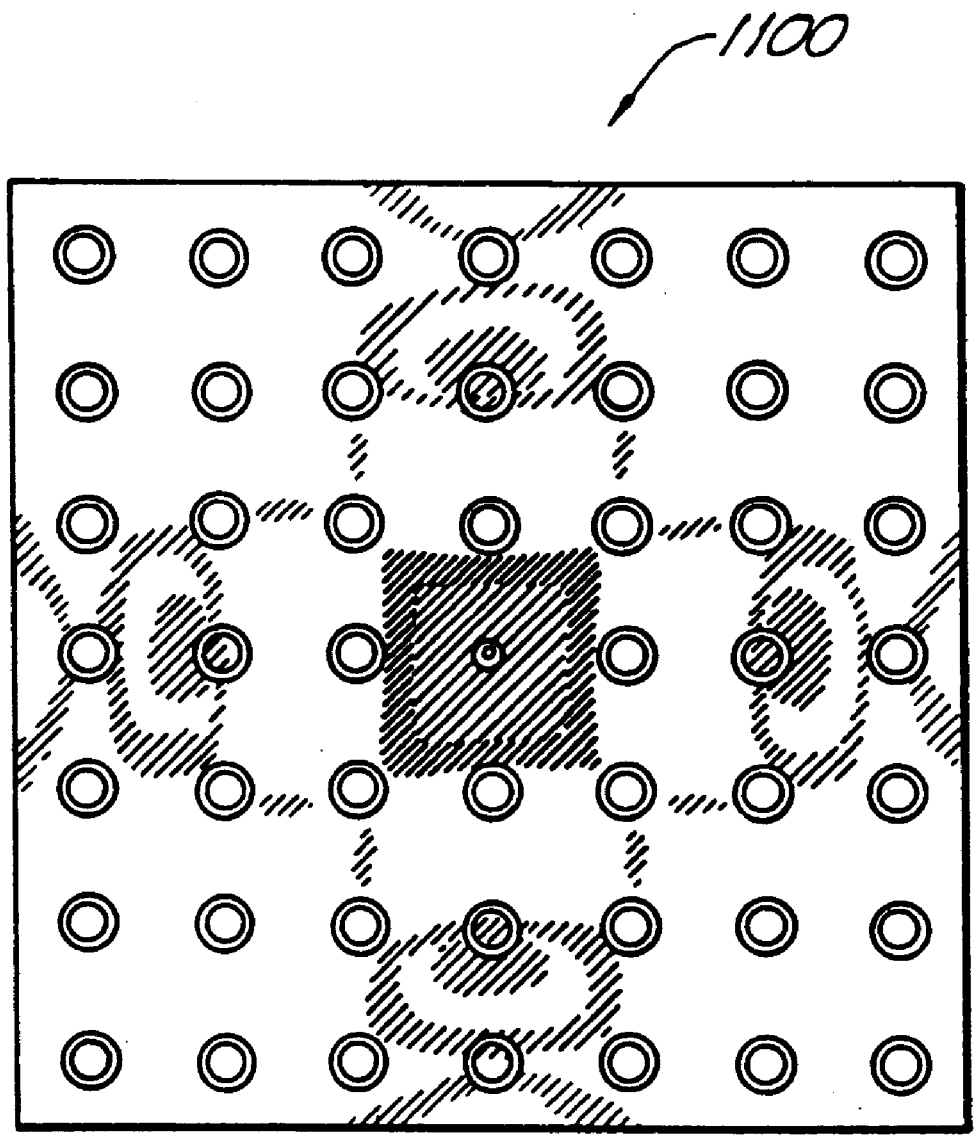
FIG. 11 is a top view of a point defect state in a true two-dimensional system (square lattice of rods)

Now that the quasi-3D composite photonic crystal is configured, creating a defect state is relatively easy. For example, changing the size and/or dielectric constants of one or more of the rods will create a defect state. If the dielectric constant of one of the rods is decreased (or, equivalently, decrease its radius), a defect state arises. FIGS. 10A and 10B are cross sections of a point defect state in a quasi-3D photonic crystal 1000 including a defect rod 1002 in accordance with the invention with the component of the electric field parallel to the rods. FIG. 10A is a side view in a plane intersecting the axis of the defect rod. FIG. 10B is a top view in a plane bisecting the axis of the defect rod. The high spatial locality and its similarity in cross section to the corresponding defect state in the pure two-dimensional system of FIG. 11 will be noted. FIG. 11 is a top view of a point defect state in a true two-dimensional system 1100 (square lattice of rods). The component of the electric field parallel to the rods is shown (TM mode).

It turns out that one can achieve a higher Q (slower rate of leakage) by having a more delocalized state that is only a small perturbation on the original crystal. In this case, this is accomplished by changing the dielectric constants of 5 rods in "plus" pattern from 11.56 to 9. This yields a defect state with a Q of 1882.

Compare this to the system with the Bragg mirrors replaced by a material with the same average dielectric constant. The configuration has the same band structure, except that it doesn't have the two "bubbles" on the sides since there is no Bragg gap. The resulting system depends solely on index confinement to prevent light from escaping perpendicular to the guide crystal. When the same defect is made, it is found that the resulting Q is 1300. Thus, the addition of the Bragg "bubbles" on the side from the barrier crystals enhances the quality factor by almost 50% in this case. If air had been used on both sides, the greatly increased index contrast would have boosted the Q to over 2000. However, a crystal formed of rods suspended in air cannot actually be constructed. The rods have to be supported on something.

Another possibility is to have a Bragg mirror on one side of the guide crystal, but only air on the other side. Here, only index confinement is used on the side with the air, although the index contrast is higher than the index contrast with the Bragg mirrors. In this case, again for the same defect, a Q of 1637 is obtained. The result is worse than both the case with two Bragg mirrors and the case with air on both sides. The reason being that the configuration involves having broken the symmetry of the system. Not only can the defect mode couple to what was formerly an inaccessible even mode, but also the former odd mode is no longer guided for all k-points in the Brillouin zone. This results in a defect state that is made up of states that were extended even in the unperturbed system. In short, it is better to have a symmetric structure.

At this point, the parameters of the system have not been tweaked in order to optimize the structure. There are many things that can be done. Simply by making the rods a little longer, it turns out that one can push the Q up to almost 2200. Other improvements would be to increase the radius of the rods (which will enhance the index contrast), vary the spacing of the Bragg mirrors (or even add extra layers of different thicknesses or dielectric constants), and further extend the size of the defect. Separating the Bragg mirrors slightly from the guide crystal (with low-index extensions of the rods) would also probably enhance the Q (by reducing the coupling of the defect state with states in the Bragg mirrors). These are only minor modifications. One could easily completely change the structure, while preserving the essential character of the defect state, by using a different lattice or a barrier crystal with 2D periodicity, for example.

Although the capability to trap light in a point defect is critical for most applications, it is also important to be able to build a one-dimensional waveguide, a line defect. It turns out that such a configuration is possible in a quasi-3D system. The same structure can be configured in TIR structures and (of course) in true 3D crystals. The fundamental reason is that, for a line defect, the system is still periodic in one direction, and thus there is one wavenumber k to work with. A point defect has no k and can interact with any state in the band structure that has the same frequency as it. A line defect, since it has a k, cannot interact with states having a different k. The foregoing restriction permits us to create a state that interacts with nothing else and thus cannot escape.

Figure 12:
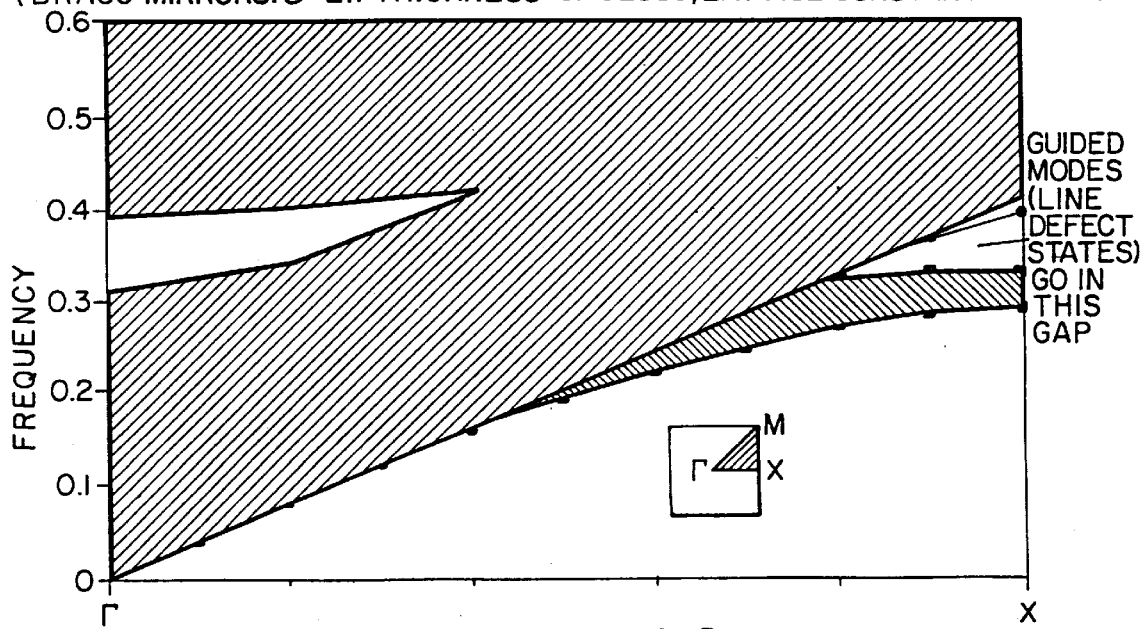
FIG. 12 is a plot of the band structure of a quasi-3D composite photonic crystal projected onto the Γ-X direction.

A line defect can be created, for example, by slightly decreasing the dielectric constants of a horizontal line of rods. In this case, the band structure is projected onto the G-X direction, and is shown in FIG. 12. FIG. 12 is a plot of the band structure of a quasi-3D composite photonic crystal projected onto the Γ-X direction, and is the framework in which a line defect can be created. The rod height is slightly different than in the structure of FIG. 8. From the plot, it is shown that the gap in the guided mode remains, and in this gap the line defect creates a band of localized states.

Figure 13A:
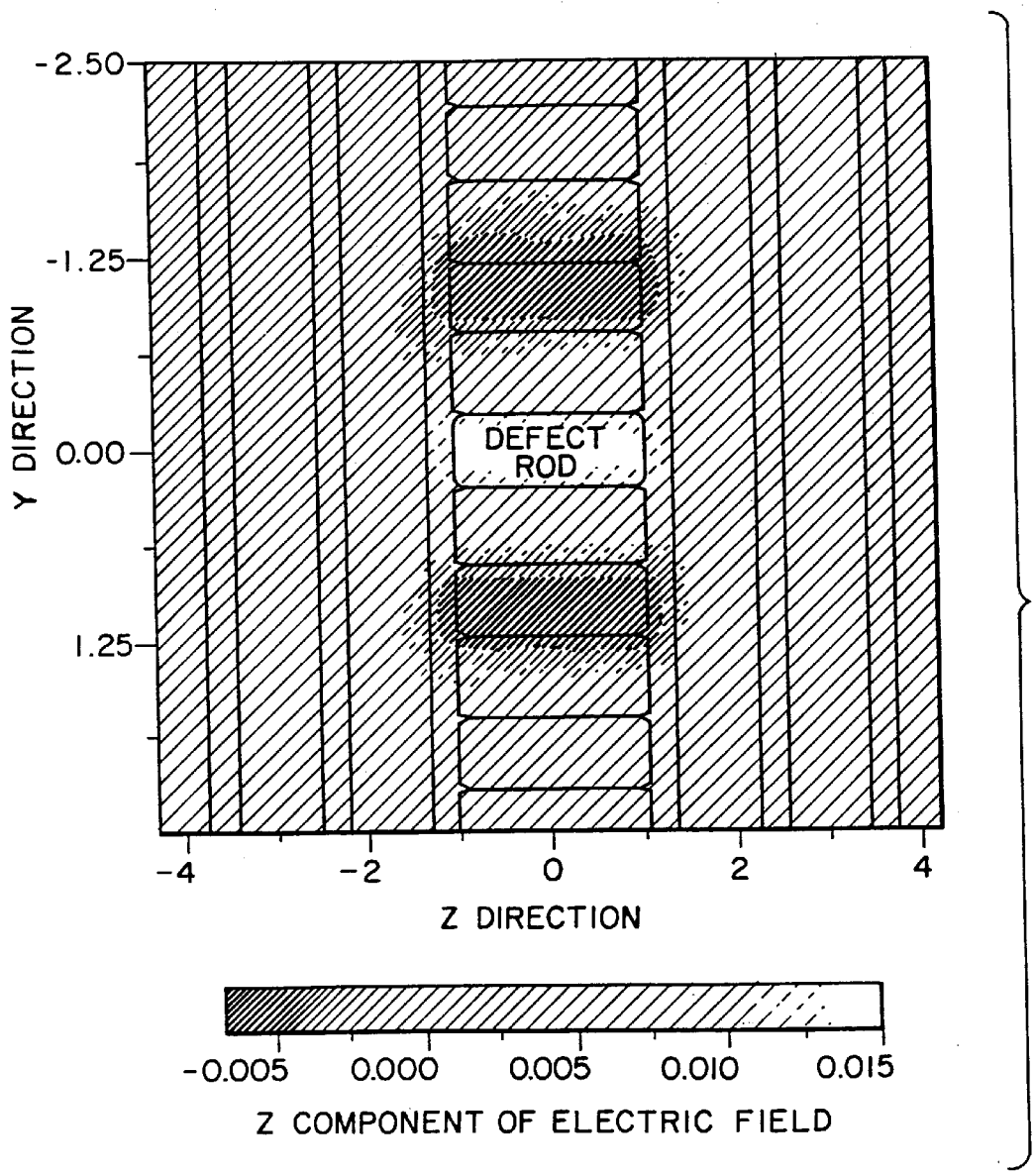
FIGS. 13A and 13B are side view and top view cross sections, respectively, of a line defect state in a quasi-3D composite photonic crystal.
Figure 13B:
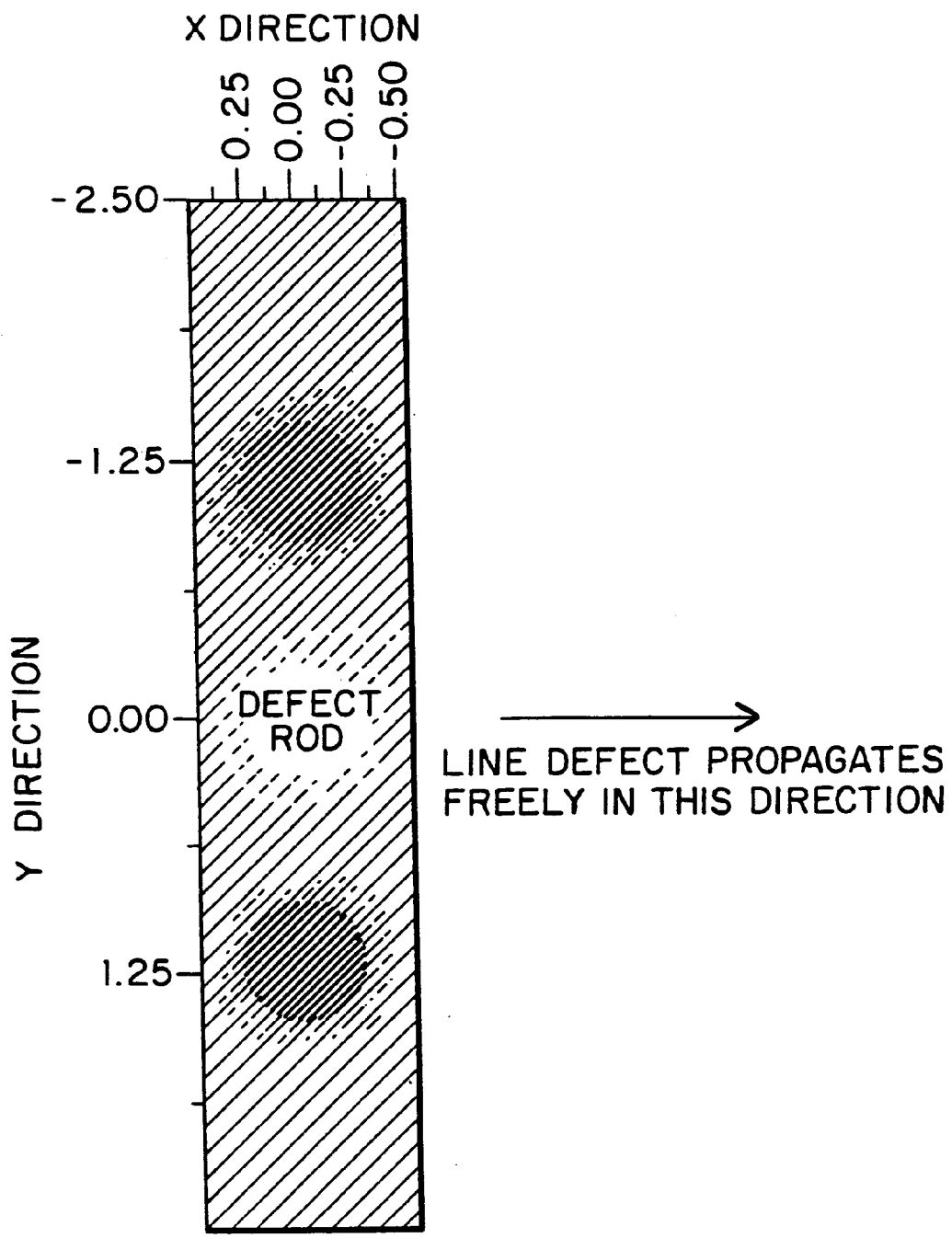

These states are localized in only the two directions perpendicular to the waveguide, and consist of modes that propagate along the defect. FIGS. 13A and 13B are side view and top view cross sections, respectively, of a line defect state in a quasi-3D composite photonic crystal 1300. The defect state is shown in a 5×1 cell, and it is extended in the direction shown.

Figure 14:
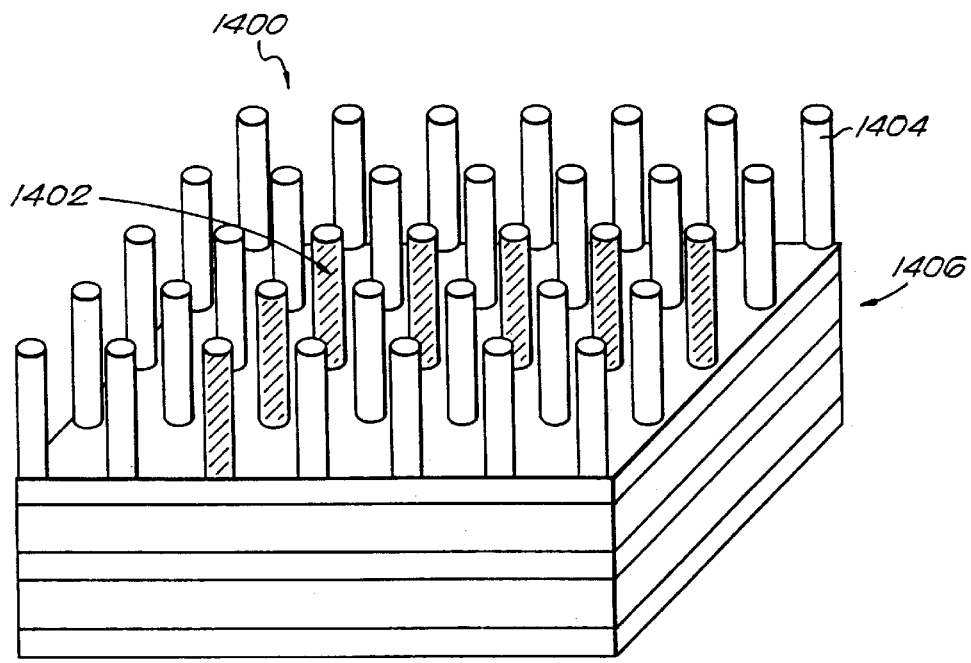
FIG. 14 is a block diagram of a quasi-3D composite photonic crystal having a line defect with a bend.

Although light may be perfectly confined in a line defect, even in the quasi-3D structure, this is no longer true as soon as a bend is introduced, as in the structure shown in FIG. 14. FIG. 14 is a block diagram of a quasi-3D composite photonic crystal 1400, similar to the structure of FIG. 9, having a line defect 1402 with a bend positioned in a square lattice of rods 1404, and barrier crystals 1406. The defect rods can have, for example, a different dielectric constant as in FIG. 13, or a different radius. At a bend, light can escape, and the degree of confinement is related to the Q of point defects in the same structure. Since quasi-3d composite photonic crystals permit high-Q point defects, it will be possible to maintain good confinement in waveguides with sharp bends.

Although the present invention has been shown and described with respect to several preferred embodiments thereof, various changes, omissions and additions to the form and detail thereof, may be made therein, without departing from the spirit and scope of the invention.

What is claimed is:

1. A composite photonic crystal structure comprising:
a guide crystal configured in a plane having a dielectric periodicity in at least a first direction in said plane; and
barrier crystals configured above and below said guide crystal to confine light within said guide crystal, said barrier crystals having a dielectric periodicity in at least a second direction not in said plane.

2. The structure of claim 1, wherein said guide crystal comprises a two-dimensionally periodic photonic crystal.

3. The structure of claim 2, wherein said barrier crystals comprise a one-dimensionally periodic photonic crystal.

4. The structure of claim 2, wherein said barrier crystals comprise a two-dimensionally periodic photonic crystal.

5. The structure of claim 1, wherein said guide crystal comprises a one-dimensionally periodic photonic crystal.

6. The structure of claim 5, wherein said barrier crystals comprise a two-dimensionally periodic photonic crystal.

7. The structure of claim 1, wherein the combination of said guide crystal and said barrier crystals exhibits a partial three-dimensional photonic band gap.

8. The structure of claim 1, wherein said barrier crystals comprise a dielectric periodicity in at least a second direction orthogonal to said plane.

9. The structure of claim 8, wherein said guide crystal and said barrier crystal have respective photonic band gaps that are aligned to define a partial three-dimensional photonic band gap.

10. The structure of claim 1, wherein said guide crystal includes one or more localized defect regions, each of which breaks the periodicity of the guide crystal in one or both periodic directions.

11. The structure of claim 10, wherein a three-dimensionally localized point defect region breaks the periodicity of both periodic directions of the guide crystal forming a resonant cavity.

12. The structure of claim 11, wherein a light-emitting material is included in said point defect region for the purpose of enhancing extracted light.

13. The structure of claim 11, wherein the optical modes of one or more line defect regions are coupled to the optical modes of one or more point regions.

14. The structure of claim 10, wherein a two-dimensionally localized line defect region breaks the periodicity of only one of the periodic directions of a two-dimensionally periodic guide crystal, forming a linear waveguide.

15. The structure of claim 14, wherein two line defect regions intersect to form a bend.

16. The structure of claim 14, wherein three or more line defect regions intersect to form a junction or splitter.

17. The structure of claim 14, wherein the optical modes of one or more line defect regions are coupled to the optical modes of one or more point defect regions.

18. The structure of claim 10, wherein the defect regions include active or nonlinear optical materials.

19. A composite photonic crystal structure comprising:
   a guide crystal configured in a plane having a dielectric periodicity in at least one dimension; and
   a barrier crystal configured adjacent said guide crystal to confine light within said guide crystal, said barrier crystal having a dielectric periodicity in at least two dimensions.

20. The structure of claim 19, wherein said guide crystal comprises a two-dimensionally periodic photonic crystal.

21. The structure of claim 19, wherein said barrier crystals comprise a two-dimensionally periodic photonic crystal.

22. The structure of claim 19, wherein said guide crystal comprises a one-dimensionally periodic photonic crystal.

23. The structure of claim 19, wherein said barrier crystals comprise a dielectric periodicity in at least a second direction orthogonal to said plane.

24. The structure of claim 19, wherein said guide crystal includes one or more localized defect regions, each of which breaks the periodicity of the guide crystal in one or both periodic dimensions.

25. The structure of claim 24, wherein a three-dimensionally localized point defect region breaks the periodicity of both periodic dimensions of the guide crystal, forming a resonant cavity.

26. The structure of claim 25, wherein a light-emitting material is included in said point defect region for the purpose of enhancing extracted light.

27. The structure of claim 25, wherein the optical modes of one or more line defect regions are coupled to the optical modes of one or more point defect regions.

28. The structure of claim 24, wherein a two-dimensionally localized line defect region breaks the periodicity of only one of the periodic dimensions of a two-dimensionally periodic guide crystal, forming a linear waveguide.

29. The structure of claim 28, wherein two line defect regions intersect to form a bend.

30. The structure of claim 28, wherein three or more line defect regions intersect to form a junction or splitter.

31. The structure of claim 28, wherein the optical modes of one or more line defect regions are coupled to the optical modes of one or more point defect regions.

32. The structure of claim 24, wherein the defect regions include active or nonlinear optical materials.

* * * * *